United States Patent [19]
Hsieh et al.

[11] Patent Number: 5,989,442
[45] Date of Patent: Nov. 23, 1999

[54] WET ETCHING

[75] Inventors: Hsien-Fen Hsieh; Ming-Teh Hsu, both of Hsinchu, Taiwan

[73] Assignee: Industrial Technology Research Institute, Hsinchu, Taiwan

[21] Appl. No.: 08/783,305

[22] Filed: Jan. 10, 1997

[51] Int. Cl.[6] .............................. H01B 13/00; B44C 1/22
[52] U.S. Cl. ................. 216/13; 216/46; 216/100
[58] Field of Search ................. 216/90, 99, 100, 216/46, 13

[56] References Cited

U.S. PATENT DOCUMENTS 3,847,690  11/1974  Campbell, Jr. et al. ................. 156/13
5,429,911  7/1995  Togawa et al. ......................... 430/320

FOREIGN PATENT DOCUMENTS 1486799  6/1967  France .

*Primary Examiner*—R. Bruce Breneman
*Assistant Examiner*—George Goudreau
*Attorney, Agent, or Firm*—David E. Dougherty

[57] ABSTRACT

Method for wet etching where proper arrangements of the substrates during the growth of the insulation layer is adopted. An insulation layer is prepared on the surface of a substrate at the area where thin film circuits are positioned. On the surfaces of the substrate where the thin film circuits are not positioned are prepared protective layers. During the wet etching the attack by the etchant may be avoided. The material of the insulation layer and the protection layer may be the same. The material of the protection layer may be the photo-resistant used in the wet etching process. The invention also disclosed circuit components prepared with the wet etching of this invention.

1 Claim, 2 Drawing Sheets

| CONTENT \ ELEMENT | Ni | Cr | Fe (FROM SUBSTRATE) |
|---|---|---|---|
| RESULT ETCHANT | 1.02ppm | 0.765ppm | 58.5ppb |
| START ETCHANT | 19.5ppb | 3.30ppb | 48.2ppb |

FIG. 3

| CONTENT \ ELEMENT | Ni | Cr | Fe (FROM SUBSTRATE) |
|---|---|---|---|
| RESULT ETCHANT | 0.270ppm | 0.615ppm | 3.775ppm |
| START ETCHANT | 19.5ppb | 3.30ppb | 48.2ppb |

FIG. 4

WET ETCHING

FIELD OF THE INVENTION

The present invention relates to a method and device for wet etching, especially to pretreatment prior to wet etching of substrates containing metal elements (including alloy and cermet) to form circuit patterns. The present invention also discloses forming an insulating layer on the exposed surface of the substrate prior to etching.

BACKGROUND OF THE INVENTION

The semiconductor technology is not only applied to the preparation of integrated circuits on substrates containing silicon, but also applicable to applications for commercial products containing non-silicon substrates. Examples of these applications include sensors for thin film strain gauges. Prior to the deposition of the pattern, in order to ensure the electrical insulation between the metal substrate and the circuit, at least an insulation layer is formed on the surface of the metal substrate at the area where the circuits are grown.

In the conventional art, during the deposition of the insulation layer, the substrates are positioned as closed as possible with each other so to increase the productivity and uniformity. During the growth of the pattern every substrate is placed side by side against other substrates. In addition, according to the physical characteristics as required, the figure of the substrate varies in a wide range. This includes high substrates (>10 mm) and deep openings. These factors make it difficult for the insulation layer to be coated on the substrate with uniformity along the whole surface. Especially, the side planes of the substrate or the openings are least likely to be coated with the insulation layer.

After the insulation layer is prepared, wet etching is subsequently processed. During the etching, not only the resistance layer but also the surface of the metal substrate is exposed to the etching solution. Owing to the coupling effect, the etching efficiency of the noble components will be retarded, compared with the speed while it is not coupled, but the etching efficiency of the active components will be accelerated in comparison with the speed while it is not coupled. In this case, the resistor of the coupled assembly is a noble component and the substrate is an active component. The etching efficiency to the resistor layer will therefore be retarded or even ceased at much higher temperature. The adhesion of the photoresist to the underlying circuit film will then be severely influenced which can subsequently lead to poor pattern definition and process reproducibility. When photoresist peels, the etching will even be stopped. Furthermore, owing to the accelerated corrosion of the substrate, the geometric size of the substrate can not be maintained.

It is thus a need in the industry to have an improvement in the wet etching so that the etching ability of the etchant can be maintained while the corrosion to the substrate can be avoided.

OBJECTS OF THE INVENTION

The object of the invention is to provide a method for wet etching which provides a complete protection layer to the substrate against the etchant.

Another object of the invention is to provide a method for wet etching with higher etching efficiency, ensured fine control of the feature size of the circuit patterns, greater process latitude and better geometric control of the substrates.

Another object of the invention is to provide a circuit component prepared according to the method of this invention.

SUMMARY OF THE INVENTION

According to the present invention, a method for wet etching is provided. Under the method o this invention proper arrangements of the substrates during the growth of the insulation layer is adopted. The surfaces of the substrate where the thin film circuits are not prepared are also deposited or covered with a passive protection layers. During the wet etching, the interference caused by the substrate to the etching characteristics may thus be eliminated. In the method of this invention, the material of the insulation layer and the protection layer may be the same. The material of the protection layer maybe the photo-resistant used in the etching. The invention also disclosed circuit components prepared with the wet etching of this invention.

The above and other objects and advantages of this invention may be fully understood from the detailed specification by referring to the following drawings.

In the drawings,

FIG. 3 shows data of quantitative analysis for the solution after NiCr etching, of an embodiment of this invention.

FIG. 4 shows data of quantitative analysis for the solution after NiCr etching, of the conventional art.

DETAILED DESCRIPTION OF THE INVENTION

Figure 1:
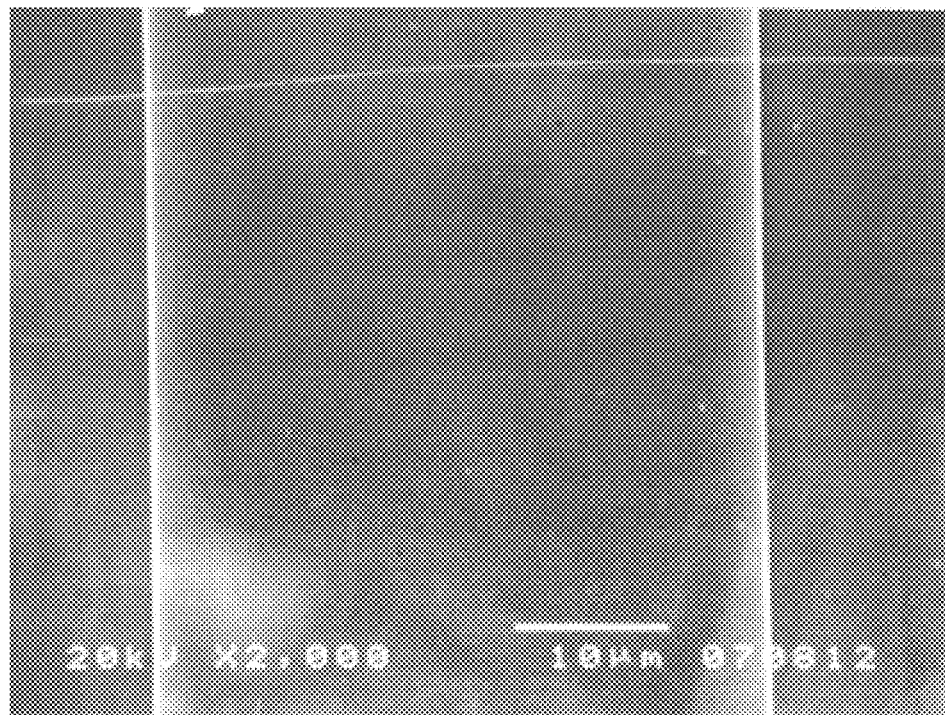
FIG. 1 illustrates a NiCr resistor pattern prepared according to the method of this invention, as inspected with a scanning electronic microscope.

The wet etching of the present invention is applicable to thin films prepared under chemical vapor deposition or sputter deposition.

At first, substrates are processed by machining, polish and cleanness. An insulation protection layer is then prepared on the exposed surfaces of each substrate prior to the deposition of the circuit film.

In the embodiment of this invention, the insulation/protection layer is prepared in two steps. At the first step, an appropriate insulation film (or films) is prepared on the surface of the substrate where circuit film is to be grown. While the insulation layer is being prepared, placed side by side with others but are placed leaving space between substrate and substrate. As a result, not only the upper surface of the substrate but also the edge surfaces of the substrate are coated with a uniformed insulation layer.

In the second step of the preparation of the insulation/protection layer, the substrates are rotated 180 degrees such that the originally lower surfaces of the substrates are facing up. The substrates are places with space between them and an insulation layer which is inactive to the etchant is deposited on the surface other than the lower side already coated, of every substrate. The thickness of the second insulation layer may be decided depending on the purposes of applications. If necessary, additional protection layer(s) may be prepared to strengthen the protection to particular surface areas of the substrates.

Besides deposition, the preparation of the insulation/protection layer may be accomplished by coating or by bonding.

After the circuit film is prepared, wet etching may be processed according to any appropriate conventional art.

In the preparation of the insulation/protection layer, the material as deposited in the two steps may be the same. The material as deposited in the second step may be the photo-resistant used in the wet etching.

Because of the insulation/protection layer, not only the etching efficiency may be enhanced but fine control of the feature size can also be obtained. In addition, the attack by the etchant on the substrate can be completely avoided.

EMBODIMENT

The following is a description to the embodiment of the wet etching of this invention.

A binocular load cell dimensioned 50 mm*6 mm*7 mm and made of stainless steel is prepared. Followed by polish, thermal treatment, cleaning and dehydration baking, the samples are ready to be deposited with insulation film. Specimen A is chemically vapor deposited with $SiO_2$ on the whole exposed chemically vapor deposited with $SiO_2$ on the whole exposed surfaces of the substrate according to the process of this invention. Specimen B is also chemically vapor deposited with an $SiO_2$ layer but only on the surface where the circuit film will be subsequently grown.

Both Specimen A and Specimen B are then sputter-deposited with an NiCr (60/40) alloy. The thickness of the deposition is about 2000 Å. The specimens are then subject to lithographic process and etching process in conc. HCl.

The specimens are tested with the following results:

1. Etching efficiency: The stainless steel substrate of Specimen A is well protected by the $SiO_2$ protection layer. NiCr film of 2000 Å thickness on top of the $SiO_2$ layer can be completely patterned at temperature under 40 degrees Celsius in conc. HCl after etching for about 45 seconds. On the other hand, the substrate of Specimen B is not protected. Etching of the NiCr film can not take place in conc. HCl until the reaction temperature exceeds 55 degrees Celsius. During the etching process, once the temperature decreases slightly, the etching will be terminated or retarded significantly. The process latitude is much low. Nevertheless, the etching process costs time for as long as several minutes. Under such etching conditions, the loss of adhesion at the resist-film interface leads to failure of dimensional control of the feature pattern, especially for the positive photo-resistant.

Figure 2:
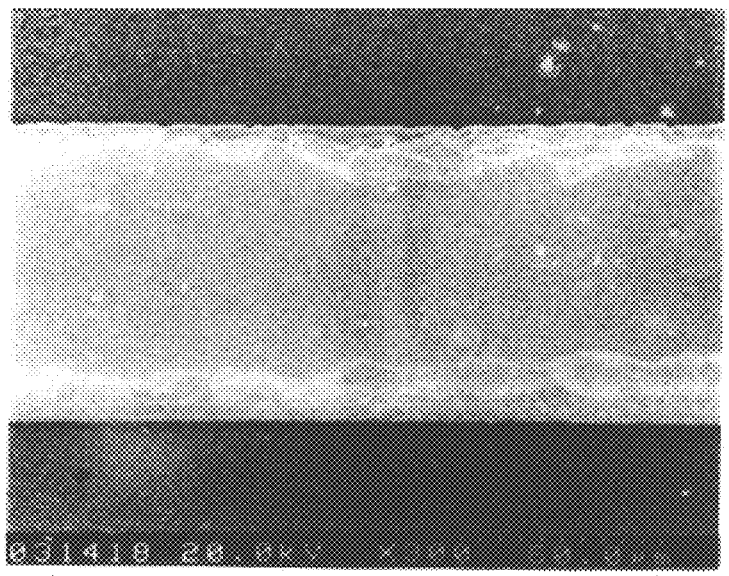
FIG. 2 illustrates a NiCr resistor pattern prepared according to the conventional art, as inspected with a scanning electronic microscope.

2. Quality of the pattern: The pattern of the NiCr resistor layer of Specimen A is precisely reproduced in its original pattern as shown in FIG. 1. The pattern of the NiCr resistor layer of Specimen B is distorted due to the attack by the etchant along the edge of the pattern, as shown in FIG. 2. The resolution of the pattern of Specimen B is lower than required.

3. Corrosion resistance of the substrate: Due to the existence of the protection layer, the stainless steel substrate of Specimen A is not corroded. Observation shows that no bobbles are found on the substrate. Microanalysis to the etching solution after the etching shows that the substrate is not attacked by the etchant. FIG. 3 show data of quantitative analysis for the etching solution after etching of an NiCr (60/40) film is accomplished, as tested by an inductive coupled plasma spectrometer. In Specimen B eye observation shows that many bubbles cling to all sides of the stainless steel substrate except the plane where $SiO_2$ grows even before the etching starts. FIG. 4 shows data of quantitative analysis for the etching solution after etching of an NiCr (60/40) film is accomplished, as tested by an inductive coupled plasma spectrometer. After the resistor pattern is accomplished, the size of the substrate is reduced for approximately 10 μm at a certain areas. This result has already exceeded the tolerance limits in the control of the feature sizes of lead cells.

As the present invention has been shown and described with reference to preferred embodiments thereof, those skilled in the art will recognize that the above and other changes may be made therein without departing from the spirit and scope of the invention.

What is claimed is:

1. A method for wet etching comprising the steps of:
    a) providing an electrically conductive metal substrate;
    b) polishing, cleaning and dehydrating the surfaces of a metal substrate;
    c) placing a substrate on a base and coating the upper and edge surfaces of the substrate by the chemical vapor deposition of $SiO_2$ thereon;
    d) turning the substrate over on the base so that the original lower surface of the substrate is facing up and depositing an insulating layer on the upper and edge surfaces of the substrate;
    e) depositing a NiCr layer of about 2000 Å thickness on the upper surface of the $SiO_2$ coating; and
    f) preparing a circuit pattern on the NiCr layer, by wet etching in concentrated HCl at a temperature below 40° C.

* * * * *